United States Patent [19]

Webb

[11] Patent Number: 5,039,945

[45] Date of Patent: Aug. 13, 1991

[54] SINGLE WINDING MAGNETOMETER WITH AUTOMATIC DISTORTION COMPENSATION

[76] Inventor: Spencer L. Webb, 313 Gage Hill Rd., Pelham, N.H. 03076

[21] Appl. No.: 499,957

[22] Filed: Mar. 27, 1990

[51] Int. Cl.[5] .................... G01R 33/04; G01C 17/28
[52] U.S. Cl. ...................................... 324/253; 33/361
[58] Field of Search ........... 324/253, 254, 255, 117 R; 340/870.33; 33/361

[56] References Cited

U.S. PATENT DOCUMENTS 3,281,670 10/1966 Myers et al. ...................... 324/253

Primary Examiner—Walter E. Snow

[57] ABSTRACT

The effects of non-equal saturation spikes in a magnetic oscillator magnetometer utilizing a magnetic core sensing inductor are compensated by adding the average inductor current to both the high and low current magnitude limits. In particular, each of the current limits is selected to be a fixed current (which is greater than that required to saturate the core) offset by the average current flowing in the core.

The effects of magnetic core hysteresis and series resistance between the inductor and its drive sources are compensated by controlling the drive voltage levels so that the time during which the inductor is driven by current in one direction is equal to the time during which it is driven by current in the other direction.

33 Claims, 4 Drawing Sheets

WINDING RESISTANCE COMPENSATION IMPLEMENTED

SINGLE WINDING MAGNETOMETER WITH AUTOMATIC DISTORTION COMPENSATION

FIELD OF THE INVENTION

This invention relates to single-winding magnetometers and, in particular, to single-winding magnetometers utilizing a magnetic oscillator.

BACKGROUND OF THE INVENTION

Magnetometers are useful in a variety of applications which include sensing external magnetic fields, measuring the strength of an external magnetic field and measuring the amplitude of a current. Magnetometers are particularly useful in non-contact current measurement because they can sense the amplitude of a current by measuring the magnetic field that the current generates.

One conventional prior art design is known as a single-winding magnetic oscillator magnetometer and a fundamental block diagram of such a device is shown in FIG. 1. The device consists of two voltage sources 100 and 102, a switch 104, and an inductor 108. Inductor 108 may be either a toroid or a solenoid and usually consists of a core fabricated from a magnetic material wound with a plurality of wire turns. In operation, inductor 108 is placed in the external magnetic field of interest and driven by voltage sources 100 and 102. In particular, voltage sources 100 and 102 each produce the same fixed output voltage with respect to ground or another reference potential and are connected to inductor 108 by means of switch 104 and lead 106.

Switch 104 is controlled so that its position is dependent on the magnitude of the current (I) running through inductor 108. In particular, the magnitude of the current (I) through inductor 108 is sensed and when the sensed magnitude reaches a first predetermined limit, switch 104 is reversed in position. If switch 104 is in the position shown in FIG. 1 connecting voltage source 108 to inductor 108, current (I) will increase in the direction shown until the first predetermined magnitude limit is reached. At that time, the position of switch 104 is changed so that voltage source 102 is connected to inductor 108 The current (I) then decreases and reverses in direction until a second symmetrical limit is reach, at which time, switch 104 is again reversed in position. Thus, the current through inductor 108 oscillates between two fixed current limits.

As mentioned above, in a typical prior art apparatus, inductor 108 is fabricated with a magnetic core. The magnetic core material is carefully chosen to be a material which saturates abruptly at a low saturation flux density. The first and second current magnitude limits which control switch 104 are chosen so that they are greater than the saturation current of inductor 108. In this manner, inductor 108 will be well saturated before the current magnitude limits are reached.

Assuming for the purposes of discussion, that inductor 108 is comprised of an ideal material with no hysteresis, FIG. 2 shows an idealized waveform of the current (I) running through inductor 108 versus time when inductor 108 is not in an external magnetic field. At the left hand side of FIG. 2, switch 104 is set to the position shown in FIG. 1. In accordance with normal voltage/current relation of an inductor, the inductor current increases linearly as shown in section 200 of the inductor current curve. At the point 202, the magnetic material comprising the core of inductor 108 saturates. As is well known, after saturation, for a given inductor voltage the inductor current increases rapidly. Consequently, the inductor current increases rapidly in area 204 until it reaches the upper current magnitude limit 214 of the switch 104. At this point, as previously mentioned, switch 104 changes position to connect voltage source 102 to inductor 108.

Since voltage source 102 is poled oppositely from source 100, the inductor current begins to decrease. As the magnetic core is still saturated at this point, the inductor current rapidly decreases until the inductor core comes out of saturation at point 205. In an inductor with a core made of a hysteresis-free material, point 205 would occur at the same inductor current at which the inductor went into saturation (point 202).

The inductor current then decreases in region 206 eventually becoming negative until inductor core saturates in the opposite direction at point 208. Consequently, the inductor current decreases very rapidly in area 210 until the negative current magnitude limit 216 of switch 104 is reached. At this point, switch 104 then changes position disconnecting voltage source 102 from inductor 108 and reconnecting voltage source 100. This latter connection causing the inductor current to rapidly increase in the saturation area 210 until the inductor core again comes out of saturation at point 209 after which, the inductor current linearly increases in area 212.

This operation continues with the inductor current oscillating between the upper current magnitude limit 214 and the lower current magnitude limit 216. The current waveform is approximately triangular with "saturation spikes" occurring where the inductor core saturates. An examination of FIG. 2 indicates that the area under the inductor waveform in the positive current area and the area under the inductor waveform in the negative inductor current area are the same so that the time-averaged inductor current is zero when averaged over a large number of cycles.

FIG. 3 shows the idealized inductor current waveform when inductor 108 is in the presence of an external, constant-value, uniform magnetic field. In FIG. 3, joints of the waveform which correspond to those in FIG. 2 have equivalent numbering. For example, the portion of the curve at which the inductor linearly increases (portion 200 shown in FIG. 2) is equivalent to curve portion 300 shown in FIG. 3. As shown in FIG. 3, the saturation of the core will no longer occur at the inductor current magnitude at which saturation occurred in the absence of the external field because in one direction, the magnetization of the core will be augmented by the external field, but in the other direction the magnetization will be hindered.

More particularly, it can be seen that the entire inductor waveform curve is shifted upward via a net amount 320 which is proportional to the net current induced in the inductor by the external field. However, the current magnitude limits have been set high enough so that, with the exception of the saturation spikes, the current waveform is undistorted. Consequently, the value of the external field can be measured by time-averaging the inductor current.

Unfortunately, in a typical prior art circuit, this field measurement is distorted by the presence of the saturation spikes in areas 304 and 310 for, as can be shown in FIG. 3, in the presence of an external field, the areas under the saturation spikes are no longer equal. If these spikes have a small area, the inaccuracy introduced is small, but it has been determined empirically that the error introduced into the measurement because of the unequal height of the saturation spikes is significant.

Another problem with the prior art circuit shown in FIG. 1 arises due to a phenomenon known as magnetic hysteresis which is present in all magnetic materials to some extent. The hysteresis effect in the inductor core causes the inductor current at which the core saturates to be different from the inductor current at which the core comes out of saturation. In particular, the current at which the core saturates is typically different than that required to bring the core out of saturation. FIG. 4 of the drawing shows an idealized inductor current waveform in an inductor fabricated with a core material in which hysteresis is present. FIG. 4 is equivalent to FIG. 2 in that the inductor is not subject to an external magnetic field. As with FIG. 3, parts of the waveform in FIG. 4 which correspond to FIG. 2 have been given equivalent numerals.

An examination of FIG. 4 indicates that the current 402 at which the inductor core saturates is not the same as the current 405 at which the core comes out of saturation. However, an examination of FIG. 4 indicates that the inductor current waveform is still symmetrical about the average current line. Consequently, the core hysteresis effect does not introduce a measurement error into the output which concerns only the time-averaged value of the current waveform.

However, in a practical circuit, there will always be a resistance electrically connected in series with the inductor windings resulting either from a current sense resistor (used to sense the inductor current and control the switch 104), resistance in the inductor windings themselves, the output resistance of the voltage sources 100 and 102, or a combination of all three sources. The series resistance has a deleterious effect when there is an external field present and a net time-averaged current is flowing through the system. The net current caused by the external field causes a voltage drop across the resistance which, in turn, has the effect of unbalancing sources 100 and 102 and causing the drive voltages produced by sources 101 and 102 to be higher in one direction and lower in the other.

Since the current through the inductor will change faster with increased drive voltage and slower with decreased drive voltage, the effect of having asymmetrical drive voltages in the presence of an external field is to make the areas under the positive and negative portions of the inductor current waveform to be unequal. This effect is shown in FIG. 5 in which the area 522 under the inductor positive current waveform and the area 524 under the inductor negative current waveform are no longer equal because the decreasing current ramp produced by source 102 spends more of its time below the current axis due to the hysteresis effect.

A similar problem occurs if voltage sources 100 and 102 become unbalanced for other reasons. As shown in FIG. 5, the problem manifests itself as gain error in the case of a series resistance or an offset in the case of unbalanced voltage sources.

Accordingly, it is an object of the present invention to provide a magnetic-oscillator magnetometer with improved accuracy.

It is another object of the present invention to provide a magnetic-oscillator magnetometer which automatically compensates for the effect of unequal saturation spike area.

It is a further object of the present invention to provide a magnetic-oscillator magnetometer in which the effects of unequal voltage drive sources is compensated.

It is still another object of the present invention to provide a magnetic-oscillator magnetometer in which the effect of series resistance in the inductor drive circuit is compensated.

It is yet another object of the present invention to provide a magnetic-oscillator magnetometer in which compensation is automatic and does not need to be manually changed during the operation of the circuit.

SUMMARY OF THE INVENTION

The foregoing objects are achieved and the foregoing problems are solved in one illustrative embodiment of the invention in which the effects of non-equal saturation spikes are compensated by adding the average inductor current to both the high and low current magnitude limits. In particular, each of the current limits is selected to be a fixed current (which is greater than that required to saturate the core) offset by the average current flowing in the core.

The effects of hysteresis and series resistance are compensated by controlling the drive voltage levels so that the time during which the inductor is driven by current in one direction is equal to the time during which it is driven by current in the other direction. These latter constraints insure that the inductor is being driven by symmetrical drive voltages in both directions. If the volt-seconds required to saturate the core in one direction is equal and opposite to the volt-seconds required to saturate the core in the other direction, then the resistance error is compensated.

DETAILED DESCRIPTION OF THE PREFERRED EMBODIMENTS

Figure 1:
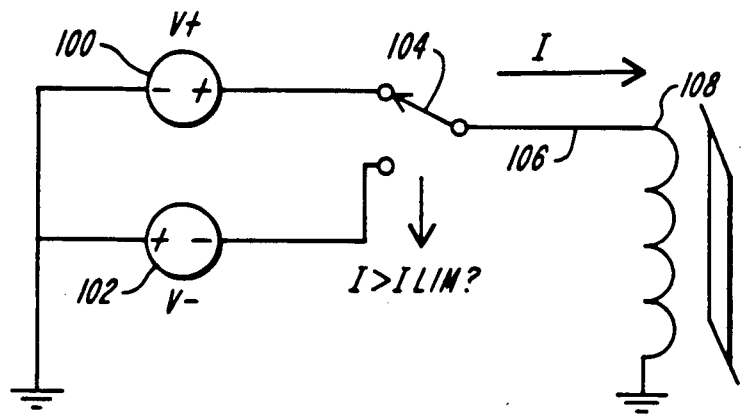
FIG. 1 is a basic functional block diagram of a prior art magnetic oscillator magnetometer.
Figure 2:
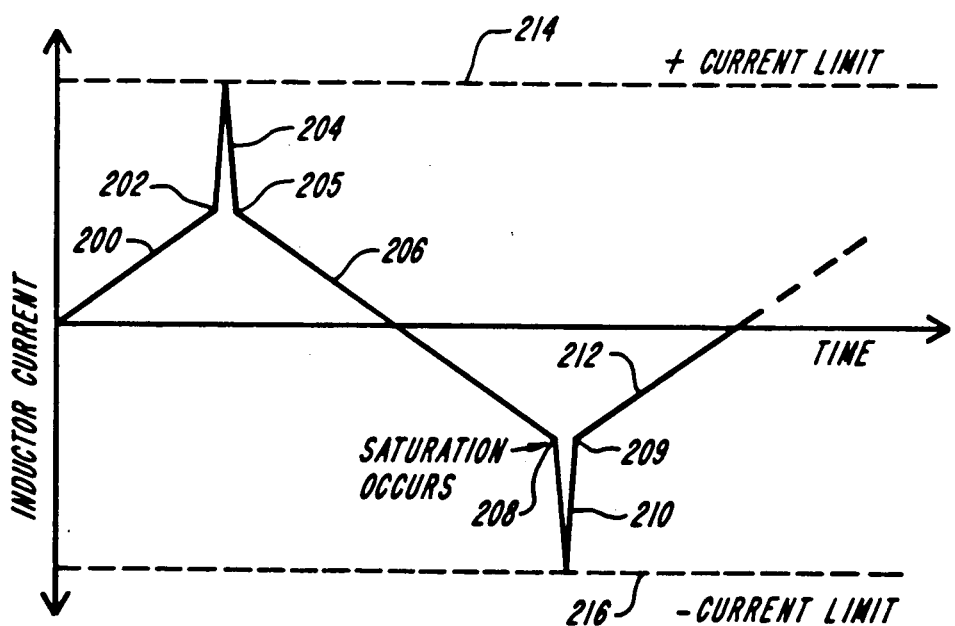
FIG. 2 is an idealized current waveform of the inductor current in the prior art magnetometer shown in Fig 1 in the absence of an external magnetic field.
Figure 3:
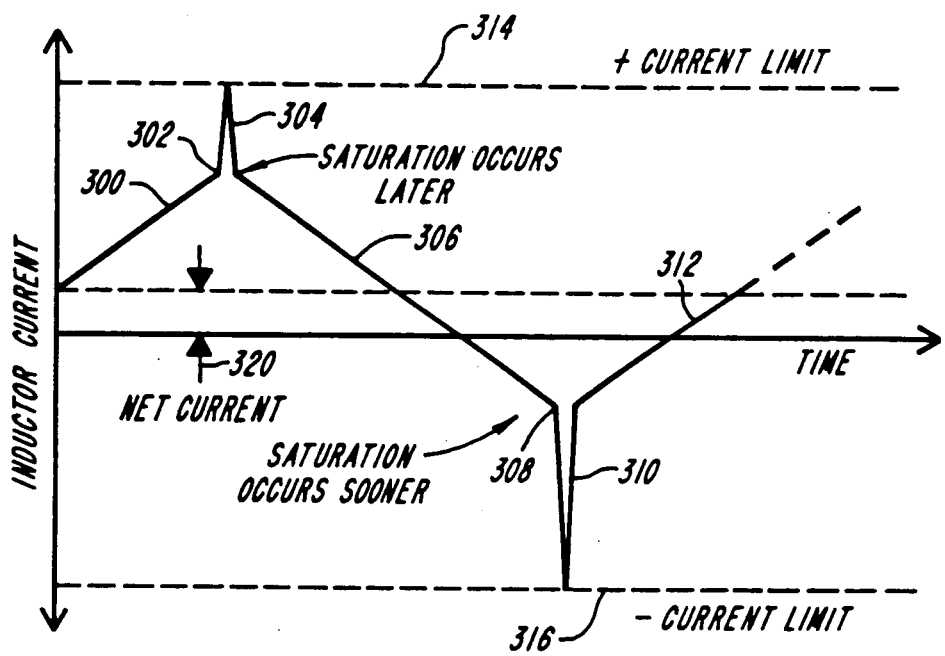
FIG. 3 is an idealized current waveform of the inductor current in the prior art magnetometer of FIG. 1 in the presence of a constant, uniform external magnetic field.
Figure 4:
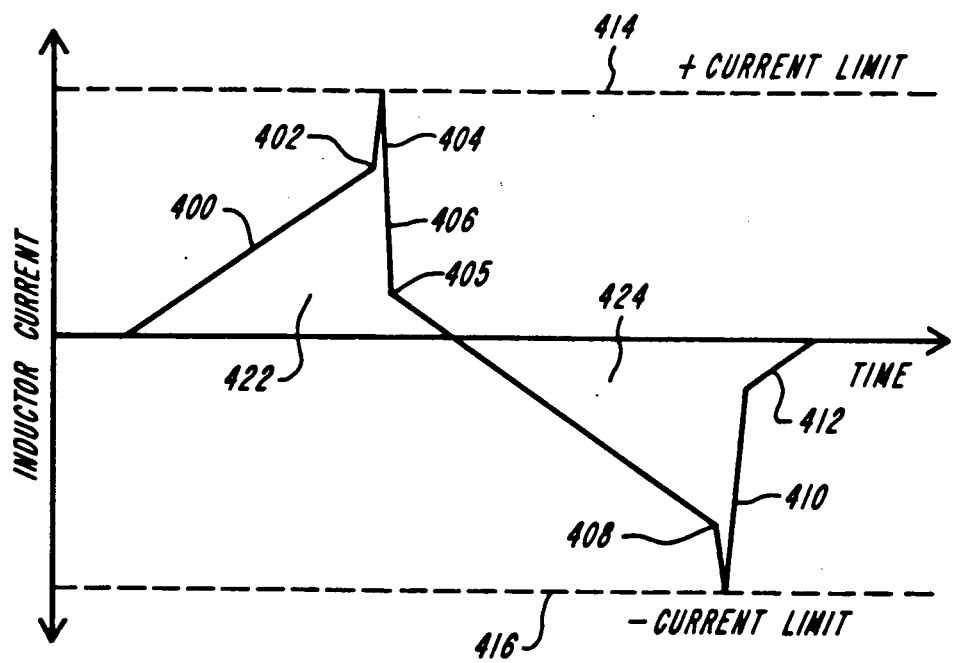
FIG. 4 is an idealized current waveform of the inductor current in the prior art magnetometer of FIG. 1 when the inductor core material is comprised of a material which exhibits magnetic hysteresis.
Figure 5:
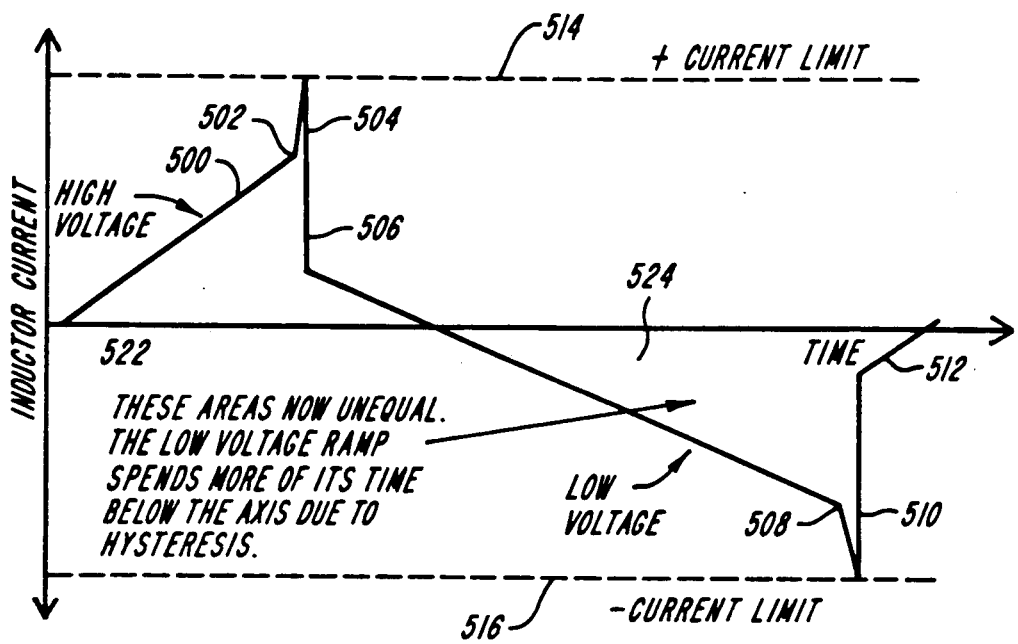
FIG. 5 is an idealized current waveform of the inductor in the prior art magnetometer shown in FIG. 1 when the core is comprised of a magnetic material that exhibits hysteresis and a driving voltage imbalance exists.
Figure 6:
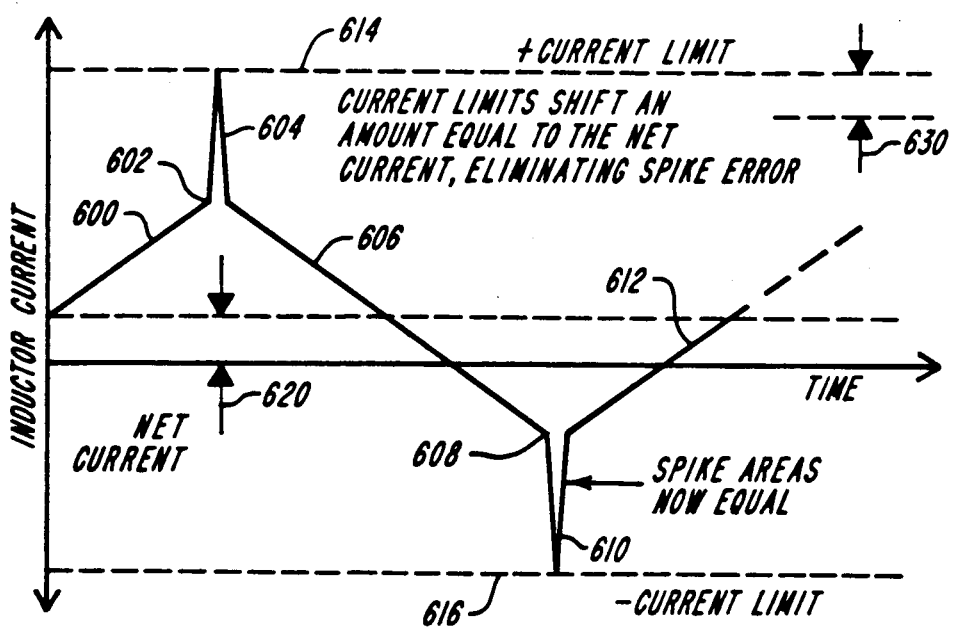
FIG. 6 is an idealized current waveform of the inductor current in an illustrative magnetometer which utilizes the inventive adaptive current limit feature.

FIG. 6 shows a diagram of an idealized inductor current waveform in a magnetometer constructed in accordance with one aspect of the present invention. In particular, FIG. 6 shows the idealized current waveform in the presence of an external magnetic field. Accordingly, it is similar to the waveform shown in FIG.

3. However, in FIG. 6, both the positive and negative current limits, 614 and 616, have been adjusted by an amount 630 equal to the net current 620 flowing through the magnetometer inductor due to the external field. In this manner, the spike areas 604 and 610 are now made equal and the spike error is eliminated.

Figure 7:
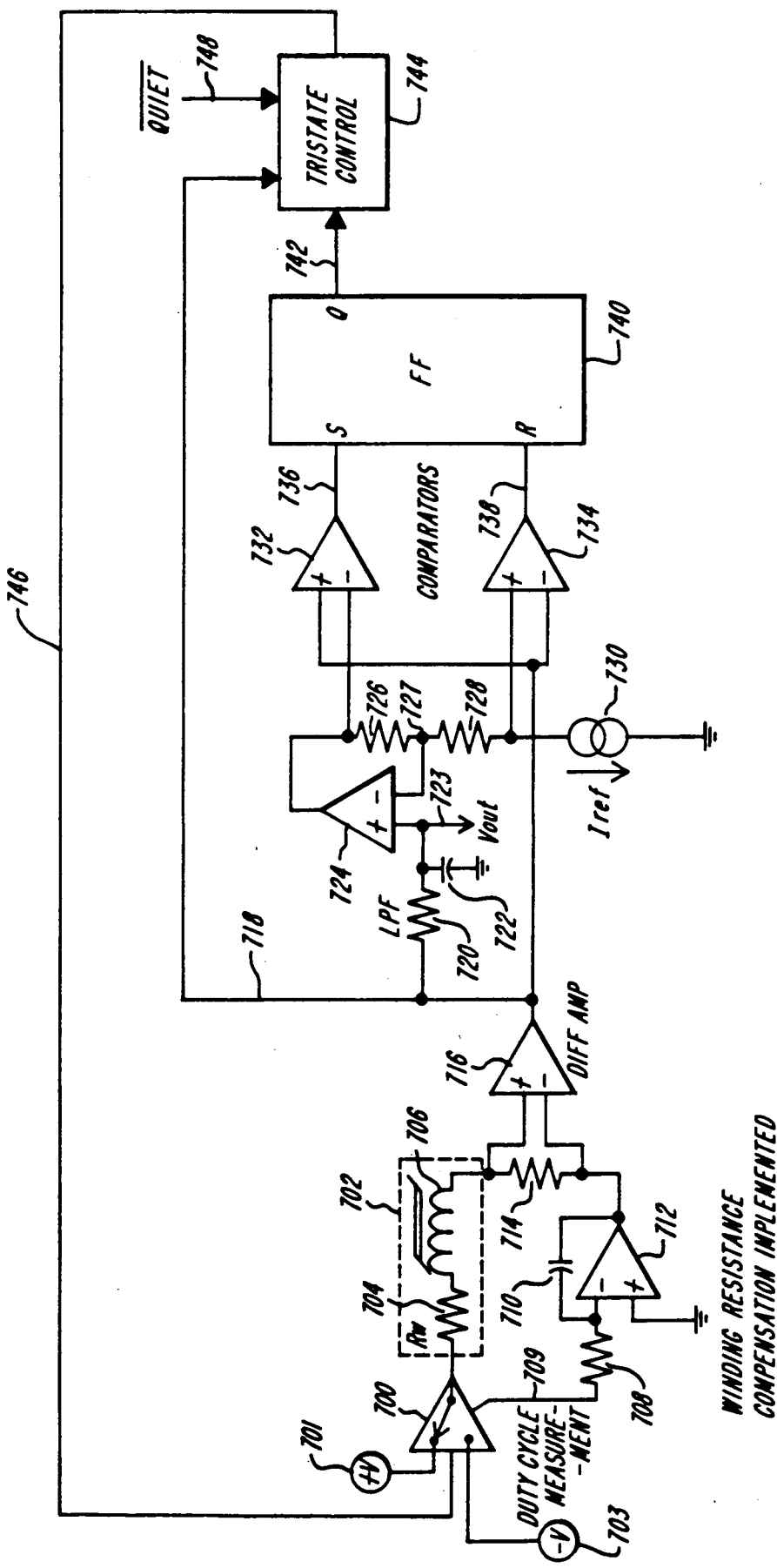
FIG. 7 is an electrical block schematic diagram of one illustrative embodiment of the invention incorporating both adaptive current limit compensation and resistance compensation.

A circuit which performs such an adjustment and also compensates for series resistance errors is shown in Fiq. 7. In FIG. 7, inductor 702 is modeled by a resistance-free, saturable inductor 706 in series with a resistance 704 which might represent voltage source resistance or inductor winding resistance or another source of series resistance.

Inductor 702 is connected to the output of a driver amplifier 700. Driver amplifier 700 can connect inductor 702 to either positive voltage source 701 or negative voltage source 703 under control of a signal on switching lead 746. This signal, as will hereinafter be explained, is developed by the switching control circuitry based on the current running through inductor 702 and the aforementioned current limits.

In particular, the current running through inductor 702 is sensed by current sensing resistor 714. The voltage developed across resistor 714 due to the inductor current is applied to the positive and negative inputs of a differential amplifier 716 which thereupon develops a voltage signal proportional to the current flowing through inductor 702. The output of differential amplifier 716 is provided to the positive input of comparator 732 and the negative input of comparator 734 which comparators determine the upper and lower current magnitude limits to control driver amplifier 700 as explained below.

The output of differential amplifier 716 is also applied to a low-pass filter comprised of resistor 720 and capacitor 722 to develop an output voltage Vout on lead 723 which is indicative of the external field applied to inductor 702.

In accordance with one aspect of the invention, the reference voltages which determine the point at which comparators 732 and 734 switch are varied in accordance with the average output current (as shown in FIG. 6) to eliminate saturation spike error. In particular, the output voltage on lead 723, which is indicative of the average current flowing through inductor 702, is applied to an operational amplifier 724.

The current magnitude switching limits for comparators 732 and 734 are potentials developed across resistors 726 and 728 by current source 730 which draws a predetermined current through resistors 726 and 728. However, operational amplifier 724 adjusts the voltage at the midpoint of resistors 726 and 728 in accordance with the output on lead 723. This adjustment causes the switching points of comparators 732 and 734 to develop offsets based on the average current flowing through inductor 702. More particularly, if the average current flowing through inductor 702 increases, the voltage at the positive input of operational amplifier 724 will also increase and the operation of the feedback loop of operational amplifier 724 will cause the midpoint 727 between resistors 726 and 728 to increase in voltage thereby increasing the upper current magnitude limit controlled by comparator 732 and decreasing the lower current limit controlled by comparator 734. An analogous effect occurs if the average inductor current decreases.

The output 736 of comparator 732 is provided to the set input (S) of set/reset flip-flop 740. The output 738 of comparator 734 is provided to the reset input (R) of set/reset flip-flop 740. Thus, when the upper current limit is reached, comparator 732 sets flip-flop 740. Similarly, when the lower current limit is reached, comparator 734 resets flip-flop 740. The output (Q) of flip-flop 740 on lead 742 is applied to a tri-state control unit 744. The output of tri-state control unit 744 is in turn applied as a switching signal 746 to the driver amplifier 700.

Tri-state control 744 also receives a "QUIET" signal on lead 748. A "high" value applied to this lead causes the magnetic oscillator to stop oscillating and the output to hold its value. This operation allows the circuit to be put into a low-power standby state and guarantees a "clean" startup of the oscillator to prevent unpredictable startup transients.

In accordance with another aspect of the invention, the aforementioned output distortion caused by series resistance 704 is compensated by means of amplifier 712. In particular, a duty cycle signal 709 of driver amplifier 700 is applied, via resistor 708, to the negative input of amplifier 712. The duty cycle signal is a signal which follows the amplifier output but is limited to predetermined values. Amplifier 712, resistor 708, and capacitor 710 comprise an integrator which integrates the duty cycle and and applies a compensation signal to the lower end of resistor 714. Since the "lower" end of resistor 714 is the common reference potential to which voltage sources 701 and 703 are referenced, the compensation signal effectively adds to one voltage reference and subtracts from the other.

If it is assumed that the same number of volt-seconds of drive applied to inductor 706 are required to saturate the core of inductor 706 in one direction as are required to saturate the core in the other direction, then, in order to avoid output distortion, the product of the voltage and the time interval (the duty cycle) during which one voltage source drives the inductor must equal the product of the voltage and the time interval (duty cycle) during which the other voltage source drives the inductor. Consequently, the length of the time interval during which the inductor is driven by one voltage source must be varied from the length of the time interval during which the inductor is driven by the other voltage source in order to compensate for drive voltage imbalances or series resistance.

The integrator comprised of resistor 708, capacitor 710, and operational amplifier 712 adjusts the reference potential at the common end of the inductor to force the drive voltage duty cycle to 50 percent. When this loop is balanced, the shift in voltage at the "common" side of the inductor is equal and opposite to the voltage dropped across the sum of series resistance 704 and current sense resistance 714. This shift in voltage then compensates for series resistance 704 and any inbalances in voltage sources 701 and 703.

It may be necessary to limit the excursion of the output of amplifier 712 so as to effectively prevent an unwanted oscillation mode. In this mode, the output of amplifier 712 is so far from its "nominal" voltage that the inductor remains saturated at all times regardless of the state of switching amplifier 700. This state may occur upon power-up or after an extreme overload. The result is a high frequency oscillation resulting in a meaningless voltage output at node 723. Appropriate limiting of the excursion of the amplifier 712 output eliminates this state.

Although only one illustrative embodiment of the invention has been shown in detail herein, other modifications and changes will be immediately apparent to those skilled in the art. For example, series resistance compensation may be implemented by directly controlling the output voltage of amplifier 700 rather than controlling the common end of the inductor. These and other modifications are intended to be covered by the following claims.

What is claimed is:

1. In a magnetometer, having a first voltage source with a potential greater than a reference potential, a second voltage source with a potential less than said reference potential, an inductor, switch means for connecting said first voltage source and said second voltage source to said inductor to cause a current with a magnitude to run therethrough to said reference potential, means responsive to said current magnitude for controlling said switch means to connect said inductor to said first voltage source when said current magnitude reaches a first limit magnitude and to connect said inductor to said second voltage source when said current magnitude reaches a second limit magnitude, the improvement comprising:
   means responsive to said current magnitude for generating a time averaged value thereof; and
   means responsive to said time averaged value for adjusting said first limit magnitude and said second limit magnitude so that the average of said first limit magnitude and said second limit magnitude equals said time averaged value.

2. In a magnetometer, the improvement according to claim 1 wherein said adjusting means is responsive to said time averaged value for adding said time averaged value to said first limit magnitude and to said second limit magnitude.

3. In a magnetometer, the improvement according to claim 1 wherein said generating means comprises a low pass filter.

4. In a magnetometer according to claim 1 wherein said controlling means comprises a first comparator responsive to said current magnitude and to said first limit magnitude for generating a set signal, a second comparator responsive to said current magnitude and to said second limit magnitude for generating a reset signal and a flip-flop responsive to said set signal and to said reset signal for controlling said switch means, the improvement according to claim 1 wherein said adjusting means is responsive to said time averaged value for adding said time averaged value to said first limit magnitude and to said second limit magnitude so that said first and said second comparators generate said set and reset signals at magnitudes of said current dependent on said time averaged value.

5. An improved magnetometer comprising:
   a first voltage source with a potential greater than a reference potential;
   a second voltage source with a potential less than said reference potential;
   an inductor;
   switch means for connecting said first voltage source and said second voltage source to said inductor to cause a current with a magnitude to run therethrough to said reference potential;
   means responsive to said current magnitude for controlling said switch means to connect said inductor to said first voltage source when said current magnitude reaches a first limit magnitude and to connect said inductor to said second voltage source when said current magnitude reaches a second limit magnitude;
   means responsive to said current magnitude for generating a time averaged value thereof; and
   means responsive to said time averaged value for adjusting said first limit magnitude and said second limit magnitude so that the average of said first limit magnitude and said second limit magnitude equals said time averaged value.

6. An improved magnetometer according to claim 5 wherein said adjusting means is responsive to said time averaged value for adding said time averaged value to said first limit magnitude and to said second limit magnitude.

7. An improved magnetometer according to claim 5 wherein said generating means comprises a low pass filter.

8. An improved magnetometer according to claim 5 wherein said controlling means comprises a first comparator responsive to said current magnitude and to said first limit magnitude for generating a set signal, a second comparator responsive to said current magnitude and to said second limit magnitude for generating a reset signal and a flip-flop responsive to said set signal and to said reset signal for controlling said switch means and wherein said adjusting means is responsive to said time averaged value for adding said time averaged value to said first limit magnitude and to said second limit magnitude so that said first and said second comparators generate said set and reset signals at magnitudes of said current dependent on said time averaged value.

9. An improved magnetometer according to claim 5 wherein said inductor has a saturation current magnitude and said first limit magnitude and said second limit magnitude are greater than said saturation current magnitude so that said inductor saturates before said first limit magnitude and said second limit magnitude are reached.

10. An improved magnetometer comprising:
   a voltage source with a potential positive with respect to ground;
   a voltage source with a potential negative with respect to ground;
   an inductor having a winding around a core fabricated of magnetically-saturable material which saturates at a saturation current;
   switch means for connecting said positive voltage source and said negative voltage source to said inductor winding to cause a current with a magnitude to run therethrough to ground;
   means for establishing a first predetermined current limit magnitude greater than said saturation current;
   means for establishing a second predetermined current limit magnitude greater than said saturation current;
   a first comparator responsive to said current magnitude for generating a set signal when said current magnitude reaches said first predetermined current limit magnitude;
   a second comparator responsive to said current magnitude for generating a reset signal when said current magnitude reaches a second predetermined current limit magnitude;
   a flip-flop responsive to said set signal for controlling said switch means to connect said inductor to said positive voltage source and responsive to said reset signal for controlling said switch means to connect said inductor to said negative voltage source;

a low pass filter means responsive to said current magnitude for generating a time averaged value thereof; and means responsive to said time averaged value for adding said time averaged value to said first predetermined limit magnitude and to said second predetermined limit magnitude.

11. An improved magnetometer according to claim 10 wherein said low pass filter means comprises sensing means for converting said current magnitude into an analog voltage and a low pass filter for filtering said voltage.

12. An improved magnetometer according to claim 10 wherein said means for establishing said first predetermined current limit magnitude comprises a resistor and a current source for drawing a predetermined current through said resistor.

13. An improved magnetometer according to claim 10 wherein said means for establishing said second predetermined current limit magnitude comprises a resistor and a current source for drawing a predetermined current through said resistor.

14. In a magnetometer, having a first voltage source with a first potential greater than a reference potential, a second voltage source with a second potential less than said reference potential, an inductor, switch means for connecting said first voltage source and said second voltage source to said inductor to cause a current with a magnitude to run therethrough to said reference potential, means responsive to said current magnitude for controlling said switch means to connect said inductor to said first voltage source when said current magnitude reaches a first limit magnitude and to connect said inductor to said second voltage source when said current magnitude reaches a second limit magnitude so that said magnetometer oscillates with a duty cycle, the improvement comprising:

means responsive to said duty cycle for genrating a time averaged value thereof; and means responsive to said time averaged value for adjusting said first potential and said second potential until said duty cycle becomes fifty percent.

15. In a magnetometer, the improvement according to claim 14 wherein said adjusting means is responsive to said time averaged value for adjusting said reference potential thereby changing said first potential and said second potential.

16. In a magnetometer, the improvement according to claim 14 wherein said generating means comprises an integrator.

17. An improved magnetometer comprising:

a first voltage source with a first potential greater than a reference potential;

a second voltage source with a second potential less than said reference potential;

an inductor;

switch means for connecting said first voltage source and said second voltage source to said inductor to cause a current with a magnitude to run therethrough to said reference potential;

means responsive to said current magnitude for controlling said switch means to connect said inductor to said first voltage source when said current magnitude reaches a first limit magnitude and to connect said inductor to said second voltage source when said current magnitude reaches a second limit magnitude so that said magnetometer oscillates with a duty cycle;

means responsive to said duty cycle for generating a time averaged value thereof; and means responsive to said time averaged value for adjusting said first potential and said second potential until said duty cycle becomes fifty percent.

18. In a magnetometer, the improvement according to claim 17 wherein said adjusting means is responsive to said time averaged value for adjusting said reference potential thereby changing said first potential and said second potential.

19. In a magnetometer, the improvement according to claim 17 wherein said generating means comprises an integrator.

20. An improved magnetometer comprising:

a first voltage source with a potential positive with respect to a reference potential;

a second voltage source with a potential negative with respect to said reference potential;

an inductor having a winding around a core fabricated of magnetically-saturable material which saturates at a saturation current;

switch means for connecting said first voltage source and said second voltage source to said inductor winding to cause a current with a magnitude to run therethrough to said reference potential;

means connected to said switch means for generating a duty cycle signal having a first voltage magnitude when said first voltage source is connected to said inductor winding and having a second voltage magnitude when said second voltage source is connected to said inductor winding;

means for establishing a first predetermined current limit magnitude greater than said saturation current;

means for establishing a second predetermined current limit magnitude greater than said saturation current;

a first comparator responsive to said current magnitude for generating a set signal when said current magnitude reaches said first predetermined current limit magnitude;

a second comparator responsive to said current magnitude for generating a reset signal when said current magnitude reaches a second predetermined current limit magnitude;

a flip-flop responsive to said set signal for controlling said switch means to connect said inductor to said first voltage source and responsive to said reset signal for controlling said switch means to connect said inductor to said second voltage source;

an integrator responsive to said duty cycle signal for generating a time averaged value thereof; and means responsive to said time averaged value for adjusting said reference potential until said time averaged value is zero.

21. In a magnetometer, having a first voltage source with a potential greater than a reference potential, a second voltage source with a potential less than said reference potential, an inductor, switch means for connecting said first voltage source and said second voltage source to said inductor to cause a current with a magnitude to run therethrough to said reference potential, means responsive to said current magnitude for controlling said switch means to connect said inductor to said first voltage source when said current magnitude reaches a first limit magnitude and to connect said inductor to said second voltage source when said current magnitude reaches a second limit magnitude so that said magnetometer oscillates with a duty cycle, the improvement comprising:

first means responsive to said current magnitude for generating a time averaged value thereof;

first means responsive to said time averaged value for adjusting said first limit magnitude and said second limit magnitude so that the average of said first limit magnitude and said second limit magnitude equals said time averaged value second means responsive to said duty cycle for generating a time averaged value thereof; and second means responsive to said time averaged value for adjusting said first potential and said second potential until said duty cycle becomes fifty percent.

22. In a magnetometer, the improvement according to claim 21 wherein said first adjusting means is responsive to said time averaged current magnitude value for adding said time averaged current magnitude value to said first limit magnitude and to said second limit magnitude.

23. In a magnetometer, the improvement according to claim 21 wherein said first generating means comprises a low pass filter.

24. In a magnetometer according to claim 21 wherein said controlling means comprises a first comparator responsive to said current magnitude and to said first limit magnitude for generating a set signal, a second comparator responsive to said current magnitude and to said second limit magnitude for generating a reset signal and a flip-flop responsive to said set signal and to said reset signal for controlling said switch means, the improvement according to claim 1 wherein said first adjusting means is responsive to said time averaged current magnitude value for adding said time averaged current magnitude value to said first limit magnitude and to said second limit magnitude so that said first and said second comparators generate said set and reset signals at magnitudes of said current dependent on said time averaged current magnitude value.

25. In a magnetometer, the improvement according to claim 21 wherein said second adjusting means is responsive to said time averaged duty cycle value for adjusting said reference potential thereby changing said first potential and said second potential.

26. In a magnetometer, the improvement according to claim 21 wherein said second generating means comprises an integrator.

27. An improved magnetometer comprising:

a first voltage source with a potential greater than a reference potential;

a second voltage source with a potential less than said reference potential;

an inductor;

switch means for connecting said first voltage source and said second voltage source to said inductor to cause a current with a magnitude to run therethrough to said reference potential;

means responsive to said current magnitude for controlling said switch means to connect said inductor to said first voltage source when said current magnitude reaches a first limit magnitude and to connect said inductor to said second voltage source when said current magnitude reaches a second limit magnitude so that said magnetometer oscillates with a duty cycle;

first means responsive to said current magnitude for generating a time averaged value thereof;

first means responsive to said time averaged value for adjusting said first limit magnitude and said second limit magnitude so that the average of said first limit magnitude and said second limit magnitude equals said time averaged value second means responsive to said duty cycle for generating a time averaged value thereof; and second means responsive to said time averaged value for adjusting said potential and said second potential until said duty cycle becomes fifty percent.

28. An improved magnetometer according to claim 27 wherein said first adjusting means is responsive to said time averaged current magnitude value for adding said time averaged current magnitude value to said first limit magnitude and to said second limit magnitude.

29. An improved magnetometer according to claim 27 wherein said first generating means comprises a low pass filter.

30. An improved magnetometer according to claim 27 wherein said controlling means comprises a first comparator responsive to said current magnitude and to said first limit magnitude for generating a set signal, a second comparator responsive to said current magnitude and to said second limit magnitude for generating a reset signal and a flip-flop responsive to said set signal and to said reset signal for controlling said switch means and wherein said first adjusting means is responsive to said time averaged current magnitude value for adding said time averaged current magnitude value to said first limit magnitude and to said second limit magnitude so that said first and said second comparators generate said set and reset signals at magnitudes of said current dependent on said time averaged current magnitude value.

31. An improved magnetometer according to claim 27 wherein said inductor has a saturation current magnitude and said first limit magnitude and said second limit magnitude are greater than said saturation current magnitude so that said inductor saturates before said first limit magnitude and said second limit magnitude are reached.

32. In a magnetometer, the improvement according to claim 27 wherein said second adjusting means is responsive to said time averaged duty cycle value for adjusting said reference potential thereby changing said first potential and said second potential.

33. In a magnetometer, the improvement according to claim 27 wherein said second generating means comprises an integrator.

* * * * *

UNITED STATES PATENT AND TRADEMARK OFFICE
CERTIFICATE OF CORRECTION

PATENT NO. : 5,039,945

DATED : August 13, 1991

INVENTOR(S) : Spencer L. Webb

It is certified that error appears in the above-identified patent and that said Letters Patent is hereby corrected as shown below:

On the Title page

Item [73] insert Assignee --Analog Devices, Inc., Norwood, MA--

Signed and Sealed this

Twenty-third Day of February, 1993

Attest:

STEPHEN G. KUNIN

Attesting Officer     Acting Commissioner of Patents and Trademarks